US011204406B2

(12) United States Patent
Punzo

(10) Patent No.: US 11,204,406 B2
(45) Date of Patent: Dec. 21, 2021

(54) METHOD FOR DESIGNING GRADIENT COILS FOR MRI SYSTEMS, GRADIENT COILS FOR MRI SYSTEMS OBTAINED BY THE SAID METHOD AND MRI SYSTEM COMPRISING SUCH GRADIENT COILS

(71) Applicant: ESAOTE S.p.A., Genoa (IT)

(72) Inventor: Vincenzo Punzo, San Giorgio a Cremano (IT)

(73) Assignee: ESAOTE S.P.A., Genoa (IT)

( * ) Notice: Subject to any disclaimer, the term of this patent is extended or adjusted under 35 U.S.C. 154(b) by 63 days.

(21) Appl. No.: 16/510,121

(22) Filed: Jul. 12, 2019

(65) Prior Publication Data

US 2020/0132791 A1    Apr. 30, 2020

(30) Foreign Application Priority Data

Jul. 9, 2018  (EP) .................................. 18182356

(51) Int. Cl.
| | | |
|---|---|---|
| *G01R 33/385* | (2006.01) | |
| *G01R 33/565* | (2006.01) | |
| *G01R 33/36* | (2006.01) | |
| *G01R 33/3873* | (2006.01) | |
| *G01R 33/3875* | (2006.01) | |

(52) U.S. Cl.
CPC ..... *G01R 33/385* (2013.01); *G01R 33/56572* (2013.01); *G01R 33/3642* (2013.01); *G01R 33/3873* (2013.01); *G01R 33/3875* (2013.01)

(58) Field of Classification Search
CPC ............ G01R 33/385; G01R 33/56572; G01R 33/3642; G01R 33/3873; G01R 33/3875; G01R 33/3806
See application file for complete search history.

(56) References Cited

U.S. PATENT DOCUMENTS

| | | | | |
|---|---|---|---|---|
| 4,820,988 A | * | 4/1989 | Crooks | ................ G01R 33/385 324/318 |
| 4,899,108 A | * | 2/1990 | Fujita | ................ G01R 33/34069 324/318 |
| 5,036,282 A | | 7/1991 | Morich et al. | |
| 5,177,441 A | | 1/1993 | Morich et al. | |
| 7,847,546 B2 | * | 12/2010 | Takizawa | ........... G01R 33/4824 324/307 |

(Continued)

*Primary Examiner* — Susan S Lee
(74) *Attorney, Agent, or Firm* — Buchanan Ingersoll & Rooney PC

(57) ABSTRACT

A method for designing gradient coils includes the following steps: a) defining an imaging volume as an ellipsoid; b) defining an elliptic-cylindrical surface enclosing the said ellipsoid; c) defining the current density at each point of the surface by a series of basis functions and corresponding coefficients expressed in elliptic cylindrical coordinates; d) describing the magnetic field generated at a generic point by the above defined current density integrated all over the said entire elliptic-cylindrical surface; e) determining the values of the coefficients of the basis functions by solving the inverse function for describing the magnetic field; f) generating a discrete winding patter of a gradient coil by using a stream function method from the continuous current density and by using a series of scattered contours of the stream function as the design of the winding patters according to a set total number of windings.

15 Claims, 12 Drawing Sheets

(56) References Cited

U.S. PATENT DOCUMENTS

| | | | | |
|---|---|---|---|---|
| 9,075,119 B2* | 7/2015 | Terada | ............... | G01R 33/385 |
| 9,977,100 B2* | 5/2018 | Crozier | ............... | G01R 33/365 |
| 2017/0315187 A1* | 11/2017 | Umeda | ............... | G01R 33/3628 |

* cited by examiner

METHOD FOR DESIGNING GRADIENT COILS FOR MRI SYSTEMS, GRADIENT COILS FOR MRI SYSTEMS OBTAINED BY THE SAID METHOD AND MRI SYSTEM COMPRISING SUCH GRADIENT COILS

Method for designing gradient coils for MRI systems, gradient coils for MRI systems obtained by the said method and MRI system comprising such gradient coils.

BACKGROUND OF THE INVENTION

MRI systems are divided into two main families, which are defined as Total Body MRI Systems and Dedicated MRI Systems. Total body MRI Systems have a gantry in which the entire human or animal body is housed during examination. Generally, the gantry is a chamber delimited by a tube like MRI scanner. Dedicated MRI systems have gantries which dimensions are related to the dimensions of the larger anatomic target region, which has to examined. Thus, the imaging volume has a limited dimension and only the target region is housed inside the gantry, the rest of the body being outside the gantry. Further to the different form factors characterising total body and dedicated MRI systems, the fact that in dedicated MRI systems the gantry is limited to dimensions related to the ones of the target region, has the consequence that there is a strong need of optimizing the magnet design such as the magnet shape, its size and the region of homogeneity with respect to the anatomy of the patient. Consequently, also the gradient coils should be designed to meet as well as possible the previous requirements. In general gradient coils are designed considering a biplanar current distribution (split magnets) or a cylindrical configuration (whole body systems) with main field along the axes of the cylinder.

FIG. 1 shows the generic configuration of a typical dedicated MRI system. A dashed line and the numeral 100 denote the control and processing electronics of a Magnetic Resonance imaging apparatus, whereas the blocks included therein are additional functional units, or have functions accomplished by appropriately programmed or controlled units of the Magnetic Resonance imaging apparatus.

These control and processing electronics drive the magnetic structure of the MRI system comprising a magnet 110 for generating a static magnetic field B0 within a cavity at least partially delimited by the magnet and within an imaging volume V in said cavity.

In the so called dedicated MRI systems, the static magnetic field is generally oriented perpendicularly to the feet-head axis of the patient positioned in the gantry. In the total body systems, the field axis is parallel to the feet-head axis.

The Magnetic Resonance imaging apparatus includes static magnetic field B0 generators, which are denoted with numeral 111. These static magnetic field generators can be superconductive coils, resistive coils permanent magnets, or combinations thereof. In an embodiment of the present invention for simplicity the static magnetic field generator comprises two opposite magnetic poles enclosing a cavity for accommodating the body under examination, or a part thereof.

Control electronics of the static magnetic field generator are not illustrated in detail since it is part of the common general knowledge of the skilled person.

Furthermore, the magnet structure of the MRI apparatus may comprise at least one magnetic noise field compensation coil 112 for generating inside the cavity and the imaging volume V a magnetic noise compensation field which neutralizes at least partially the effect of the magnetic noise fields on the static magnetic field B0.

The system further comprises at least one exciting pulse transmission coil 113 for transmitting to the body under examination one or more sequences of RF pulses for NMR excitation which coil is controlled by a RF excitation pulse generator 101.

The magnet structure comprises magnetic gradient fields generating coils 114 for generating during scanning, a magnetic field with a predetermined variation along each of three spatial directions (x, y, z) having the function of univocally encoding the nuclear spins and thus allowing to relate the NMR signal contributions of the RF signals received by the RF antenna 115 to a position in space for reconstructing an image. The magnetic gradient fields generating coils 114 are driven by a gradient field coils driving unit 102.

The RF NMR signals are processed by a processing unit converting the RF data into image data indicated by 104 and to an image generation unit 105. The reconstructed images can be displayed on a display 120 or stored in memories 130, which can be alternatively, or in combination internal memories of the MRI apparatus or memories residing in an external storage server or in cloud servers. Optionally the images can be stored in portable memory devices 140 such as CD rom, DVD rom CD RAM, DVD RAM, memory sticks, portable hard disks, or similar devices. A user interface 109 providing alternatively or in combination different user input devices is provided. The user interface may be alternatively or in combination a graphical user interface, a vocal user interface, a keyboard, a mouse or a similar device, an input port of command strings that has been generated by a remote device.

A noise field compensation unit may be provided comprising one or more probes S1 and/or other possible probes S2, S3, S4, S5, and S6. These are connected to the input of a processing unit 103 for determining characteristic parameters of the magnetic noise field outside the cavity V of the Magnetic Resonance imaging apparatus and this characteristic data is fed to a compensation coils controller 107.

According to an embodiment, the compensation coils controller 107 is provided with a processor unit configured to calculate from theoretical or empiric functions the characteristic parameters of the magnetic noise field inside the cavity from the characteristic parameters of the noise field outside the cavity. The processor unit of the compensation coils controller is also configured to determine the magnetic noise compensation field to be generated inside the cavity for neutralizing the magnetic noise field inside said cavity. This magnetic noise compensation field is determined as a function of the characteristic parameters describing the magnetic noise field inside said cavity which has been determined from the measured characteristic parameters of the magnetic noise field outside the cavity.

The compensation coil controller 107 controls a compensation field generator 108 which provides the driving power signals for feeding the compensation coils 112.

According to an embodiment the control electronics of the MRI apparatus can be entirely or at least in part in the in the form of software units, consisting of programs for controlling programmable hardware of the Magnetic Resonance imaging apparatus, such as a PC or a central processing and control unit. Optionally the control electronics of the MRI apparatus can be entirely or in part dedicated hardware in which the functional logic is incorporated in the hardware. The compensation coils 112, already resident in the Magnetic Resonance imaging apparatus, are adapted to compensate for substantially uniform and homogeneous static field fluctuations, induced by outside magnetic fields, in the imaging cavity V. Nevertheless, some fluctuations may show some spatial variability within the cavity, i.e., spatial non-homogeneities.

According to a further embodiment, by suitably controlling gradient coils 114, compensation fields may be also generated for these field fluctuations, induced by noise fields, which have non-uniformities and non-homogeneities in space.

A bi-planar gradient coil configuration is disclosed in document U.S. Pat. No. 5,036,282. In this document, gradient coils are disclosed consisting of an assembly comprising a pair of planar x and y gradient coils each one comprising a pattern of electrically conductive coil windings distributed on a plane surface. The system is a total body MRI system with a static magnetic field generated by magnetic field generating coils in a Helmholtz configuration. The axis of the static magnetic field is parallel to the feet-head axis of the patient, which can enter the gantry only from the base of the cylindrical gantry and in the direction of the longitudinal axis of the gantry and of the magnetic structure generating the static magnetic field.

An elliptic-cylindrical gradient coil configuration is disclosed in document U.S. Pat. No. 5,177,441. The examination region is defined by an elliptically crossed-section cylinder of a non-conductive, non-magnetic material. The x, y, and z-gradient coils are mounted on elliptically crossed-section cylindrical surfaces along the former for causing gradient magnetic fields within the examination region. Each of the x, y, and z-gradient coils includes a plurality of arrays or groups of coil loops. Also in this case the system is a so called total body MRI System. Main magnetic field means generates a substantially uniform magnetic field longitudinally through an examination region. The main magnetic field means includes a plurality of main field magnets which are operated under control of a magnetic field control means and power supply. Preferably, the main magnetic field is a strong, uniform field that is aligned with a longitudinal axis, i.e. with the feet-head axis of a patient lying in the cylindrical gantry.

In both documents U.S. Pat. Nos. 5,036,282 and 5,177,441, the gradient coils are placed all around the longitudinal axis, i.e. the feet head axis of the patient. This limits the entering of the gantry by the patient to the head sides of the cylindrical gantry and the direction of entering and leaving the gantry is only the longitudinal axis. This limitation is not imposed by the mere geometry of the gradient coils and of the gradient coil disposition, but is a result of the fact that the gradient coils have to match a magnetic circuit generating a static field having a direction parallel to the feet-head axis of the patient. Therefore using a configuration according to the one disclosed in the cited documents it is not possible to have scanners with a gantry, which can be entered from different sides thereof, and particularly from a side allowing and entering direction which is perpendicular to the said longitudinal axis.

SUMMARY OF THE INVENTION

According to a first aspect of the present invention there is provided a method for designing gradient coils, the gradient coils providing for a current distribution on the lateral surface of an elliptical cylinder generating a field being perpendicular to the longitudinal axis of the elliptical cylinder, the method comprising the following steps:
a) defining an imaging volume as an ellipsoid;
b) defining an elliptic-cylindrical surface enclosing the said ellipsoid;
c) defining the current density at each point of the surface by a series of basis functions and corresponding coefficients expressed in elliptic cylindrical coordinates;
d) describing the magnetic field generated at a generic point by the above defined current density integrated all over the said entire elliptic-cylindrical surface;
e) determining the values of the coefficients of the basis functions by solving the inverse function for describing the magnetic field;
f) generating a discrete winding patter of a gradient coil by using a stream function method from the continuous current density and by using a series of scattered contours of the stream function as the design of the winding patters according to a set total number of windings.

According to an embodiment, the method is based on the target field method for calculating the coefficients of the series of trigonometric basis functions and the stream-function method for determining the winding pattern of the gradient coils.

An example of a target method for MRI transverse biplanar gradient coil design is disclosed in R. Zhang, J. Xu et all. Meas. Sci. Technol. 22 (2011) 125505 and Wentao Liu, D-Zu et all. J. Phys. D: Appl. Phys. 40 (2007) 4418-4424. An example of Stream-function method for gradient coil design is disclosed in Tomasi D. Stream function optimization for gradient coil design. (2001) Magn. Reson. Med. 45 505.

According to an embodiment, the current density at each point of the surface of the elliptical-cylinder at step c) can be expressed by a series of trigonometric basis functions in elliptical-cylinder coordinates according to the following equations:

$$J_\varphi = \sum_{p=1}^{P} U_p \beta \cos[\beta(z - z_{min})]\sin\varphi \quad (2)$$

$$J_z = -\frac{1}{h_\varphi}\sum_{p=1}^{P} U_p \sin[\beta(z - z_{min})]\cos\varphi$$

Wherein $U_p$ is the coefficient of the pth current density basis function and P is the total number of basis functions; And $$\beta = p \cdot c;\ c = \frac{\pi}{(z_{MAX} - z_{min})}\ \text{with}\ z_{MAX} = \frac{L}{2}\ \text{and}\ z_{min} = -\frac{L}{2}$$

$$h_\varphi = \sqrt{\left(\frac{\partial x}{\partial \varphi}\right)^2 + \left(\frac{\partial y}{\partial \varphi}\right)^2 + \left(\frac{\partial z}{\partial \varphi}\right)^2} = \rho\sqrt{(a\sin\varphi)^2 + (b\cos\varphi)^2}\ ;$$

on the coil surface we have $\rho=1$;
$\varphi$ is the angle between x and y axes
And considering the natural curvilinear coordinates transformation:

$x=a\rho \cos \varphi$ $y=b\rho \sin \varphi$ $z=z$

L being the length of the elliptic-cylindrical surface in the z-direction;

a and b being the maximum and the minimum radius of the elliptic cross section as graphically shown in FIG. 2.

According to an embodiment the step d) is carried out by applying the Biot-Savart law for determining the magnetic field $\vec{B}$ generated at point $P(x_p, y_p, z_p)$ by the current distribution on the cylinder surface according to the equation:

$$\vec{B}(x_p, y_p, z_p) = \frac{\mu_0}{4\pi} \int\int dS \frac{\vec{J} \times \vec{R}}{R^3} \tag{3}$$

where the integration is made on the full elliptical cylinder surface and $$\vec{J} = (J_x, J_y, J_z)$$

$$\vec{R} = (x_p - x, y_p - y, z_p - z)$$

$\vec{R}$ being the vector (distance) from the source point and the field point P.

Following the cross product in (3) the three x, Y and Z components of the magnetic field $\vec{B}$ can be determined according to the following:

For the Y component of the magnetic field $\vec{B}$ (in cartesian coordinates):

$$B_y(x_p, y_p, z_p) = \frac{\mu_0}{4\pi} \int\int dS \frac{(J_z R_x - J_x R_z)}{R^3} \tag{4}$$

in curvilinear coordinates we have:

$$J_x = \frac{1}{h_\varphi} \frac{\partial x}{\partial \varphi} J_\varphi$$

$$J_z = J_z$$

$$dS = h_\varphi d\varphi dz$$

Considering (2) and (3) the equation (4) can be written as:

$$B_y(x_p, y_p, z_p) =$$

$$-\frac{\mu_0}{4\pi} \int_{-\frac{L}{2}}^{\frac{L}{2}} dz \int_0^{2\pi} d\varphi \frac{1}{R^3} \sum_{p=1}^{P} U_p \Big\{ \sin[\beta(z - z_{min})]\cos\varphi(x_p - a\cos\varphi) +$$

$$\frac{\partial x}{\partial \varphi} \beta \cos[\beta(z - z_{min})]\sin\varphi(z_p - z) \Big\}$$

The above equation can be written in a compact form as:

$$B_y(x_p, y_p, z_p) = \sum_{p=1}^{P} U_p M_p \tag{5}$$

Where $$M_p(x_p, y_p, z_p) =$$

$$-\frac{\mu_0}{4\pi} \int_{-\frac{L}{2}}^{\frac{L}{2}} dz \int_0^{2\pi} d\varphi \frac{1}{R^3} \Big\{ \sin[\beta(z - z_{min})]\cos\varphi(x_p - a\cos\varphi) +$$

$$\frac{\partial x}{\partial \varphi} \beta \cos[\beta(z - z_{min})]\sin\varphi(z_p - z) \Big\} =$$

$$\sqrt{(x_p - a\cos\varphi)^2 + (y_p - b\sin\varphi)^2 + (z_p - z)^2}$$

The quantities $M_p(x_p, y_p, z_p)$ can be evaluated via a standard Gauss quadrature method.

An example of a standard Gauss quadrature method is disclosed in Handbook of Mathematical Functions, With Formulas, Graphs, and Mathematical Tables (1965). Milton Abramowitz e Irene A. Stegun.

For N given points in the ROI, the equation (5) can be rewritten in a matrix form:

$$B_y = M^T U \tag{6}$$

In which $$B_y = \begin{bmatrix} B_{y,1} \\ B_{y,2} \\ \dots \\ B_{y,N} \end{bmatrix}; U = \begin{bmatrix} U_1 \\ U_2 \\ \dots \\ U_P \end{bmatrix}; M^T = \begin{bmatrix} M_{1,1} & \dots & M_{1,P} \\ \vdots & \ddots & \vdots \\ M_{N,1} & \dots & M_{N,P} \end{bmatrix} \tag{6}$$

According to the above equations, the step e) is carried out by applying the following inverse function:

$$U = (M^T)^{-1} B_y^{grad} \tag{8}$$

considering for $B_y$ the desired gradient magnetic field $B_{y,i}^{grad} = G \cdot z_i$.

For Y gradient coil, considering the spatial symmetry of the desired magnetic field to generate (i.e. a field that change sign with $Y \rightarrow B_y^{grad} = G \cdot y$) the angular integration on the $\varphi$ in the equation for the quantities $M_p(x_p, y_p, z_p)$ has to be split in two parts as $$M_p(x_p, y_p, z_p) =$$

$$-\frac{\mu_0}{4\pi} \int_{-\frac{L}{2}}^{\frac{L}{2}} dz \Big\{ \int_0^{\pi} d\varphi \frac{1}{R^3} \Big\{ \sin[\beta(z - z_{min})]\cos\varphi(x_p - a\cos\varphi) +$$

$$\frac{\partial x}{\partial \varphi} \beta \cos[\beta(z - z_{min})]\sin\varphi(z_p - z) \Big\} -$$

$$\int_\pi^{2\pi} d\varphi \frac{1}{R^3} \Big\{ \sin[\beta(z - z_{min})]\cos\varphi(x_p - a\cos\varphi) +$$

$$\frac{\partial x}{\partial \varphi} \beta \cos[\beta(z - z_{min})]\sin\varphi(z_p - z) \Big\} \Big\}$$

For X gradient coil, considering the spatial symmetry of the desired magnetic field to generate (i.e. a field that change sign with $X \rightarrow B_y^{grad} = G \cdot x$) it is expected a stream function $\psi \sim \sin 2\varphi$. Then to respect equation (1), the equations (2) have to be modified as follows:

$$J_\varphi = \sum_{p=1}^{P} \frac{U_p}{2} \beta \cos[\beta(z - z_{min})]\sin 2\varphi$$

$$J_z = -\frac{1}{h_\varphi} \sum_{p=1}^{P} \frac{U_p}{2} \sin[(z - z_{min})]\cos 2\varphi$$

Consequently, the angular integration on the $\varphi$ in the equation for the quantities $M_p(x_p, y_p, z_p)$ has to be split in four parts as $$M_p(x_p, y_p, z_p) =$$

$$-\frac{\mu_0}{4\pi} \int_{-\frac{L}{2}}^{\frac{L}{2}} dz \left\{ \int_0^{\frac{\pi}{2}} d\varphi \frac{1}{R^3} \left\{ \sin[\beta(z-z_{min})]\cos 2\varphi(x_p - a\cos\varphi) + \right.\right.$$

$$\left. \frac{\partial x}{\partial \varphi} \beta \cos[\beta(z-z_{min})]\sin 2\varphi(z_p - z) \right\} -$$

$$\int_{\frac{\pi}{2}}^{\pi} d\varphi \frac{1}{R^3} \left\{ \sin[\beta(z-z_{min})]\cos 2\varphi(x_p - a\cos\varphi) + \right.$$

$$\left. \frac{\partial x}{\partial \varphi} \beta \cos[\beta(z-z_{min})]\sin 2\varphi(z_p - z) \right\} +$$

$$\int_{\pi}^{\frac{3\pi}{2}} d\varphi \frac{1}{R^3} \left\{ \sin[\beta(z-z_{min})]\cos 2\varphi(x_p - a\cos\varphi) + \right.$$

$$\left. \frac{\partial x}{\partial \varphi} \beta \cos[\beta(z-z_{min})]\sin 2\varphi(z_p - z) \right\} -$$

$$\int_{\frac{3\pi}{2}}^{2\pi} d\varphi \frac{1}{R^3} \left\{ \sin[\beta(z-z_{min})]\cos 2\varphi(x_p - a\cos\varphi) + \right.$$

$$\left.\left. \frac{\partial x}{\partial \varphi} \beta \cos[\beta(z-z_{min})]\sin 2\varphi(z_p - z) \right\} \right\}$$

Generally, the electromagnetic field problems have a unique solution. The inverse design based on the Fourier transform method avoids the ill-posed nature since Fourier transform has unique inverse. However, due to the finite size of the current surface, the integral equation technique (belonging to the typical Fredholm integral equations of the first kind) has to face the ill-posed nature of the problem. The ill-posed nature of these equations may appear either without unique solutions, or unstable solutions, or even non-existent solutions. In other words, the ill-posed degree of these equations varies depending on the choice of the target-field points. Numerically it was shown that choosing the target field points only in the first octant the problem is not ill-posed. Thus according to a further embodiment the steps described above are carried out by choosing the target field points only in the first octant.

According to an embodiment, the step f) is carried out by applying the stream function method to generate the expected discrete winding pattern from the continuous current density defined on the elliptical cylinder surface applying the relation of the stream function with the current density:

$$\vec{J} = \nabla \times \psi \qquad (9)$$

And expressed in elliptical cylinder coordinates $$J_\varphi = \frac{\partial \psi}{\partial z}$$

$$J_z = -\frac{1}{h_\varphi} \frac{\partial \psi}{\partial \varphi}$$

Where $\psi$ is the stream function.
And applying the equation (2) the streaming function is expressed as a function of the trigonometric basis functions and the coefficients:

$$\psi(z,\varphi) = \sum_{p=1}^{P} U_p \sin[\beta(z-z_{min})]\sin \varphi \qquad (10)$$

According to an embodiment, finally, a series of scattered contours of the stream function are used to produce the final current winding pattern on the elliptic cylinder surface. If the total number of the winding lines in the Z>0, Y>0 part of the surface is set as N, then the $\psi$ contour levels can be chosen as $$\psi_i = \psi_{min} + (i-0.5)I \; i=1,2,\ldots N$$

In which $$I = \frac{\psi_{MAX} - \psi_{min}}{N}$$

is the current flowing on each winding line and $\psi_{min}$, $\psi_{MAX}$ the minimal and the maximal value of the stream function on the selected part of the surface.

According to a further embodiment, the present method comprises optimization steps of the dissipated power and the stored magnetic energy inductance of the continuous current on the defined elliptic cylindrical surface according to which dissipated power on the elliptical cylinder is evaluated by applying equation $$W = \frac{\rho}{d} \int \int dS [(J_x)^2 + (J_y)^2 + (J_z)^2]$$

Where W is the dissipated power;
$J_x$, $J_y$, $J_z$ are the components of the current density vector in Cartesian coordinates;
d is the thickness of real current windings and $\rho$ the resistivity of the windings material (for example copper)

For further details, reference is made to the disclosure in Jin J. M. 1998 Electromagnetics in magnetic resonance imaging. IEEE Antennas Propag. Mag. 40 (6) 7-22.

Considering now the equations (2) and the relations between $$J_x, J_y, J_z \text{ and } J_\varphi, J_z \left( J_y = \frac{1}{h\varphi} \frac{\partial y}{\partial \varphi} J_\varphi \right)$$

equation (11) can be rewritten as $$W = \frac{1}{2} \sum_{p1=1}^{P} \sum_{p2=1}^{P} U_{p1} W_{p1,p2} U_{p2} = \frac{1}{2} U^T W U \qquad (12)$$

Where $$W_{p1,p2} =$$

$$\frac{2\rho}{d} \int_{-\frac{L}{2}}^{\frac{L}{2}} dz \int_0^{2\pi} d\varphi \frac{1}{h\varphi} \left\{ \left[ \left( \frac{\partial x}{\partial \varphi} \bigg|_{\rho=1} \right)^2 + \left( \frac{\partial y}{\partial \varphi} \bigg|_{\rho=1} \right)^2 \right] \cdot \beta_{p1} \cos[\beta_{p1}(z -$$

$$z_{min})]\sin\varphi \cdot \beta_{p2} \cos[\beta_{p2}(z-z_{min})]\sin\varphi +$$

$$\sin[\beta_{p1}(z-z_{min})]\cos\varphi \sin[\beta_{p2}(z-z_{min})]\cos\varphi \right\}$$

and $$\beta_{p1} = p1 \cdot c, \; \beta_{p2} = p2 \cdot c.$$

According to an embodiment the inductance of the coil is optimized by evaluating the stored magnetic energy starting from the equation $$E = \frac{1}{2} \iiint \vec{J} \cdot \vec{A} \qquad (13)$$

Where $\vec{A}$ is the magnetic potential vector and the integration is on the distributed volume of the current density
Applying the above equations equation (13) can be rewritten as $$E = \frac{1}{2}\sum_{p1=1}^{P}\sum_{p2=1}^{P} U_{p1} E_{p1,p2} U_{p2} = \frac{1}{2} U^T E U \tag{14}$$

Where $$E_{p1,p2} = \frac{\mu_0}{2\pi} \int_{-\frac{L}{2}}^{\frac{L}{2}} dz_{p1} \int_0^{2\pi} d\varphi_{p1} \frac{\partial x}{\partial \varphi_{p1}}\bigg|_{\rho=1} \cdot \beta_{p1}$$

$$\cos[\beta_{p1}(z_{p1}-z_{min})]\sin\varphi_{p1} \times \left[\int_{-\frac{L}{2}}^{\frac{L}{2}} dz_{p2}\right.$$

$$\int_0^{2\pi} d\varphi_{p2} \frac{\frac{\partial x}{\partial \varphi_{p2}}\big|_{\rho=1} \cdot \beta_{p2}\cos[\beta_{p2}(z_{p2}-z_{min})]\sin\varphi_{p2}}{R} \bigg] +$$

$$\frac{\mu_0}{2\pi} \int_{-\frac{L}{2}}^{\frac{L}{2}} dz_{p1} \int_0^{2\pi} d\varphi_{p1} \frac{\partial y}{\partial \varphi_{p1}}\bigg|_{\rho=1} \cdot \beta_{p1}$$

$$\cos[\beta_{p1}(z_{p1}-z_{min})]\sin\varphi_{p1} \times \left[\int_{-\frac{L}{2}}^{\frac{L}{2}} dz_{p2}\right.$$

$$\int_0^{2\pi} d\varphi_{p2} \frac{\frac{\partial y}{\partial \varphi_{p2}}\big|_{\rho=1} \cdot \beta_{p2}\cos[\beta_{p2}(z_{p2}-z_{min})]\sin\varphi_{p2}}{R} \bigg] +$$

$$\frac{\mu_0}{2\pi} \int_{-\frac{L}{2}}^{\frac{L}{2}} dz_{p1} \int_0^{2\pi} d\varphi_{p1} \sin[\beta_{p1}(z_{p1}-z_{min})]\cos\varphi_{p1} \times$$

$$\left[\int_{-\frac{L}{2}}^{\frac{L}{2}} dz_{p2} \int_0^{2\pi} d\varphi_{p2} \frac{\sin[\beta_{p2}(z_{p2}-z_{min})]\cos\varphi_{p2}}{R}\right]$$

With $$R = \sqrt{(a\cos\varphi_{p1}-a\cos\varphi_{p2})^2+(b\sin\varphi_{p1}-b\sin\varphi_{p2})^2+(z_{p1}-z_{p2})^2}$$

Solving the coefficients of the current density is now a classical matrix problem by constructing an objective function G with respect to the total square errors of the Y-axis component of the magnetic field at all target-field points inside the ROI, and in a following step two penalty items can be added to the objective function G, the stored energy and the dissipated power weighted by two undetermined penalty factors $\zeta_W$ and $\zeta_E$:

$$G = \sum_{i=1}^{N}(B_{y,i}-B_{y,i}^{grad})^2 + \zeta_W W + \zeta_E E \tag{16}$$

Where $B_{y,i}$ is the field at jth target point obtained by expression (6)

For details relating to the above reference is made to the publication A. N. Tychonoff, О решении некорректно поставленных задач и методе регуляризации [Solution of incorrectly formulated problems and the regularization method], in Doklady Akademii Nauk SSSR, vol. 151, 1963, pp. 501-504. Translated in "Soviet Mathematics", vol. 4, pp. 1035-1038.

The equation (15) can be rewritten in a matrix form as follows $$G = (M^T U - B_y^{grad})^T (M^T U - B_y^{grad}) + \tfrac{1}{2}\zeta_W U^T W U + \tfrac{1}{2}\zeta_E U^T E U \tag{17}$$

Minimizing G with respect to the unknown coefficients U one obtains $$U = (2MM^T + \zeta_W W + \zeta_E E)^{-1} 2M B_y^{grad} \tag{18}$$

According to an embodiment, the penalty factors $\zeta_W$ and $\zeta_E$ are chosen following these criteria:
1. The matrix problem is mathematically well-behaved.
2. The error between the resulting $B_y$ field and the desired $B_y^{grad}$ is within acceptable limits (5% error threshold is historically the max acceptable difference on the ROI).
3. The stored energy is low and the dissipated power is appropriate to meet the system requirement.
4. The resulting current pattern is easily to implement.

According to an embodiment, minimization of equation (18) is carried out by a constrained minimization method to find the unknown coefficients U. In particular, the following quantity is minimized:

$$Q(\zeta_W, \zeta_E) = \zeta_W W + \zeta_E E \text{ changing the parameters } (\zeta_W, \zeta_E)$$

With some constraints on the linearity of the generated magnetic field:

$$\text{MAX}(B_{y,i}-B_{y,i}^{grad}) < 5\% \; \forall \text{point inside the ROI}$$

Since 5% is the standard, allowable error in the gradient coil design.

According to a further embodiment further several geometrical constraints about minimal distance between current paths and minimal planar cross-section of each path are considered in carrying out the above minimization.

According to an embodiment the fmincon routine is used which is present inside the scientific software Matlab (Mathworks Inc.) with the "interior Point Algorithm" activated.

According to a further embodiment, the method comprises the steps of generate a set of gradient coils that cover only partially the elliptical cylinder surface by changing the equation (5 according to the following equation:

$$B_y(x_p, y_p, z_p) =$$
$$-\frac{\mu_0}{4\pi} \int_{-\frac{L}{2}}^{\frac{L}{2}} dz \int_0^{2\pi} d\varphi \frac{1}{R^3} \sum_{p=1}^{P} U_p \Big\{\sin[\beta(z-z_{min})]\cos\varphi(x_p - a\cos\varphi) +$$
$$\frac{\partial x}{\partial \varphi}\beta\cos[\beta(z-z_{min})]\sin\varphi(z_p-z)\Big\}$$

Thus obtaining the following equation $$B_y(x_p, y_p, z_p) =$$
$$-\frac{\mu_0}{4\pi} \int_{-\frac{L}{2}}^{\frac{L}{2}} dz \left[\int_{\varphi_1}^{\varphi_2} d\varphi \frac{1}{R^3} \sum_{p=1}^{P} U_p \Big\{\sin[\beta(z-z_{min})]\cos\varphi(x_p - a\cos\varphi) +\right.$$
$$\frac{\partial x}{\partial \varphi}\beta\cos[\beta(z-z_{min})]\sin\varphi(z_p-z)\Big\} +$$

-continued $$\int_{\varphi_3}^{\varphi_4} d\varphi \frac{1}{R^3} \sum_{p=1}^{P} U_p \Big\{ \sin[\beta(z-z_{min})]\cos\varphi(x_p - a\cos\varphi) +$$

$$\frac{\partial x}{\partial \varphi} \beta \cos[\beta(z-z_{min})]\sin\varphi(z_p - z) \Big\} \Big]$$

With: $0 < \varphi_1 < \varphi_2 < \varphi_3 < \varphi_4 < 2\pi$

Providing for splitting the elliptic cylindrical surface in two mechanically and electrically separated surfaces as shown in FIG. 3.

According to a further aspect of the present invention gradient coils in combination with the magnet of an MRI system, the gradient coils being driven by a control unit for generating gradient fields along three cartesian axis, the said magnet fields permeating a region of interest, the said gradient coils comprising discrete winding patterns configured to generate a current distribution on the surface of an elliptical cylinder the magnet of the MRI system generating a static magnetic field oriented perpendicular to the longitudinal axis of the said elliptic cylindrical surface.

According to an embodiment the gradient coils are configured to generate the said gradient field in a region of interest (ROI) defined by an ellipsoid enclosed in the elliptic cylindrical surface.

According to an embodiment the gradient coils are formed by three gradient coils each one of the said gradient coils generating respectively a gradient field in one of the three directions of the coordinate system, each of the said gradient coils comprising discrete winding patterns configured to generate a current distribution on the surface of an elliptical cylindrical surface, the windings of the three gradient coils extending on elliptic cylindrical surfaces layered one over the other, thus forming three layers of discrete winding patterns each one of one of the said gradient coils.

According to an embodiment, a gradient coil generating a gradient field in z-direction of the cartesian coordinate system and extending on an elliptical cylindrical surface comprises identical winding patterns on two half of the elliptic-cylindrical surface along a separation plane of the said two halves which is a plane parallel to the longitudinal axis and to the maximum radius of the elliptic-cylindrical surface, while on each half of the elliptical-cylindrical surface two winding patterns are provided which are symmetric with respect of a cross section plane at the center of the elliptical-cylindrical surface and which plane is perpendicular to the longitudinal axis of the said elliptic-cylindrical surface and parallel to the minimum and maximum radius of the elliptic cross section of the elliptic cylindrical surface.

According to a further embodiment, each winding pattern of the two symmetrical winding pattern on each half of the elliptic cylindrical surface is formed by a plurality of annular windings which are positioned one inside the other having progressively reduced dimensions.

According to an embodiment, the windings of the plurality of closed loop windings are tangent one to the other at least at two diametrically opposite points or segments thereof.

According to still a further embodiment, the said closed loop or annular windings are eccentric.

According to a further embodiment, the said closed loop or annular windings are non-circular.

In an embodiment, the said closed loop or annular windings are designed such that the more external one is essentially rectangular having a major diameter parallel to the major radius of the elliptical-cylindrical surface and the most inner one has an elliptic form while the intermediate windings progressively changes their shape from a quite rectangular of the most external one to the elliptic shape of the most internal one.

According to an embodiment the gradient coil generating a gradient field in the y-direction of the cartesian coordinate system is formed by only one winding pattern for each one of two halves of the elliptic-cylindrical surface along a separation plane of the said two halves which is a plane parallel to the longitudinal axis and to the major radius of the elliptic-cylindrical surface, the two winding patterns being symmetric relatively to a plane of symmetry which is coincident or parallel to the said plane of separation.

According to a further feature, each winding pattern is formed by a plurality of annular or closed loop windings positioned one inside the other.

In a further embodiment, the said winding patterns have a major diameter, which is parallel to the longitudinal axis of the elliptic cylindrical surface.

In an embodiment, the said closed loop or annular windings are designed such that the more external one is essentially rectangular having a major diameter parallel to the longitudinal axis of the elliptical-cylindrical surface and the most inner one has an elliptic shape while the intermediate windings progressively changes their shape from a quite rectangular of the most external one to the elliptic shape of the most internal one.

According to an embodiment, the gradient coil generating a gradient field in the y-direction of the cartesian coordinate system and extending on an elliptical cylindrical surface comprises identical winding patterns on two half of the elliptic-cylindrical surface along a separation plane of the said two halves which is a plane parallel to the longitudinal axis and to the maximum radius of the elliptic-cylindrical surface, while on each half of the elliptical-cylindrical surface two winding patterns are provided which are symmetric with respect of a section plane at the center of the elliptical-cylindrical surface and which plane is parallel to the longitudinal axis of the said elliptic-cylindrical surface and parallel to the minor axis of the elliptic cross section of the elliptic cylindrical surface.

According to a further embodiment, each winding pattern of the two symmetrical winding pattern on each half of the elliptic cylindrical surface is formed by a plurality of annular windings which are positioned one inside the other having progressively reduced dimensions.

According to still a further embodiment, the said closed loop or annular windings are eccentric.

In an embodiment, the said closed loop or annular windings are designed such that the more external one is essentially rectangular having a major diameter parallel to the longitudinal axis of the elliptical-cylindrical surface and the most inner one has an elongated shape with rounded ends while the intermediate windings progressively changes their shape from a quite rectangular of the most external one to the shape of the most internal one.

It has to be noted that the above embodiment relatively to the method and or to the gradient coil design in combination with an MRI system may be provided in any combination or sub combination.

According to a further embodiment, the invention provides for an MRI system comprising:

a gantry for accommodating a target body under examination or a part thereof;

a magnet for generating a static magnetic field in a volume of space;

gradient coils for generating gradient magnetic fields in addition to the static magnetic field according to three spatial directions;

a control unit configured to drive and control the gradient coils and the magnet;

a transmission antenna connected to an excitation signal sequence generator for transmitting spin echo excitations signals into the cavity housing the target body;

a receipt antenna for receiving the MRI signals caused by the excitation signals;

an MRI receipt signals processing unit and image generation unit for processing the signals and extracting image data information and for generating the images;

a display unit for displaying the reconstructed images;

a control unit managing the excitation signal sequence generator, the receipt signals processing unit, image generation unit and the display;

a user interface for input of MRI image acquisition settings to be specified by the user before starting with the image acquisition session;

the said gradient coils comprising discrete winding patterns extending over an elliptic-cylindrical surface which is oriented with its longitudinal axis perpendicular to the direction of the static magnetic field generated by the magnet.

According to a further embodiment, the said elliptic cylindrical surface is oriented with its minor radius or axis parallel to the direction of the static magnetic field generated by the magnet.

According to still a further embodiment which can be provided in any combination with the previous ones the elliptic cylindrical surface inscribes or encloses an imaging volume, i.e. a volume within which the magnetic field is homogeneous which has the shape of an ellipsoid.

According to a further feature, the MRI system according to one or more of the preceding embodiments is provided with gradient coils, which are designed according to one, or more of the steps described above of a method for designing gradient coils for MRI systems.

Further embodiments of the MRI system according to one or more of the previously disclosed embodiments may be provided with one or more gradient coils configurations as described previously referring to the combination of a gradient coil and an MRI system.

As it will appear from the following, elliptical cylinder gradient coils show higher efficiency (i.e.: less required current to generate the same gradient field amplitude G) than the conventional biplanar ones. The reduced size of this 3D coils is reflected in a lower electrical resistance and consequently in a lower dissipated power. In addition, the stored energy in the elliptical coils is lower than in the biplanar one with a reduced inductance. High efficiency and consequent high-gradient amplitudes provide great benefits for imaging. For example, an MRI signal can be acquired with a wide bandwidth and a short sampling time then with a short TE (Echo Time) and a high signal-to-noise ratio.

Actually, biplanar gradient coils in permanent magnet MRI systems are placed very close to ferromagnetic pole plates which are required for the homogeneity of the main magnetic field. This situation has two main effects, one positive and one negative:

The positive effect consisting in the fact that thanks to the mirror current effect, the efficiency of the planar gradient coils is increased about 30-40%. This implies a reduction of the required current and dissipated power with a current level more or less equal to the 3D coils case.

The negative effect consists in the fact that the presence of ferromagnetic planes generates eddy currents on its surfaces with an increase in the dissipated power and a reduction of the dynamic properties of the gradients. Furthermore, the induced currents have to be calibrated to avoid artefacts in MRI images.

In the case of 3D gradients as in the present embodiments, both effects are significantly attenuated due to the greater distance of the current source from the ferromagnetic planes.

DETAILED DESCRIPTION

Figure 1:
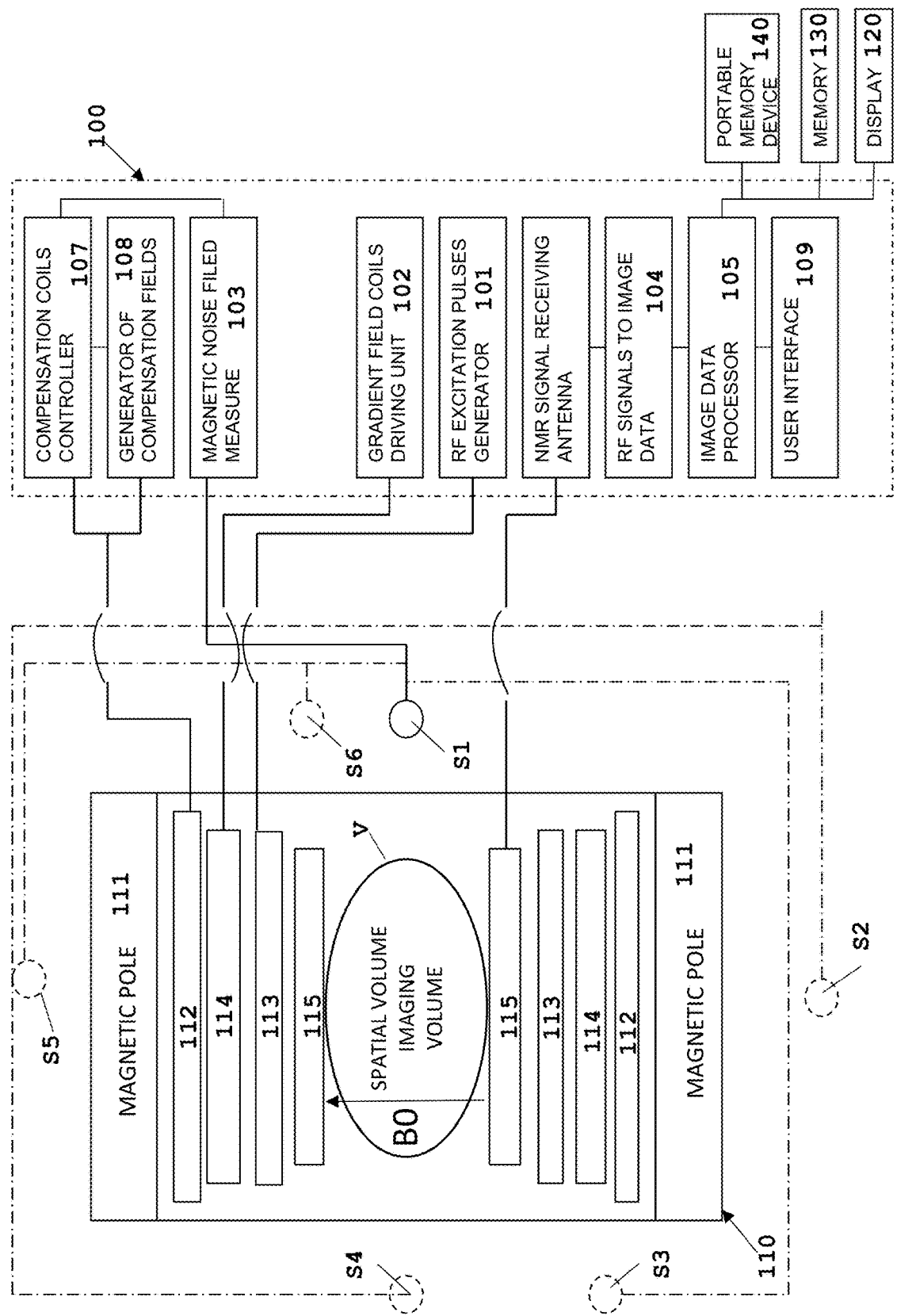
FIG. 1 schematically shows a block diagram representing a dedicated MRI imaging system.
Figure 2:
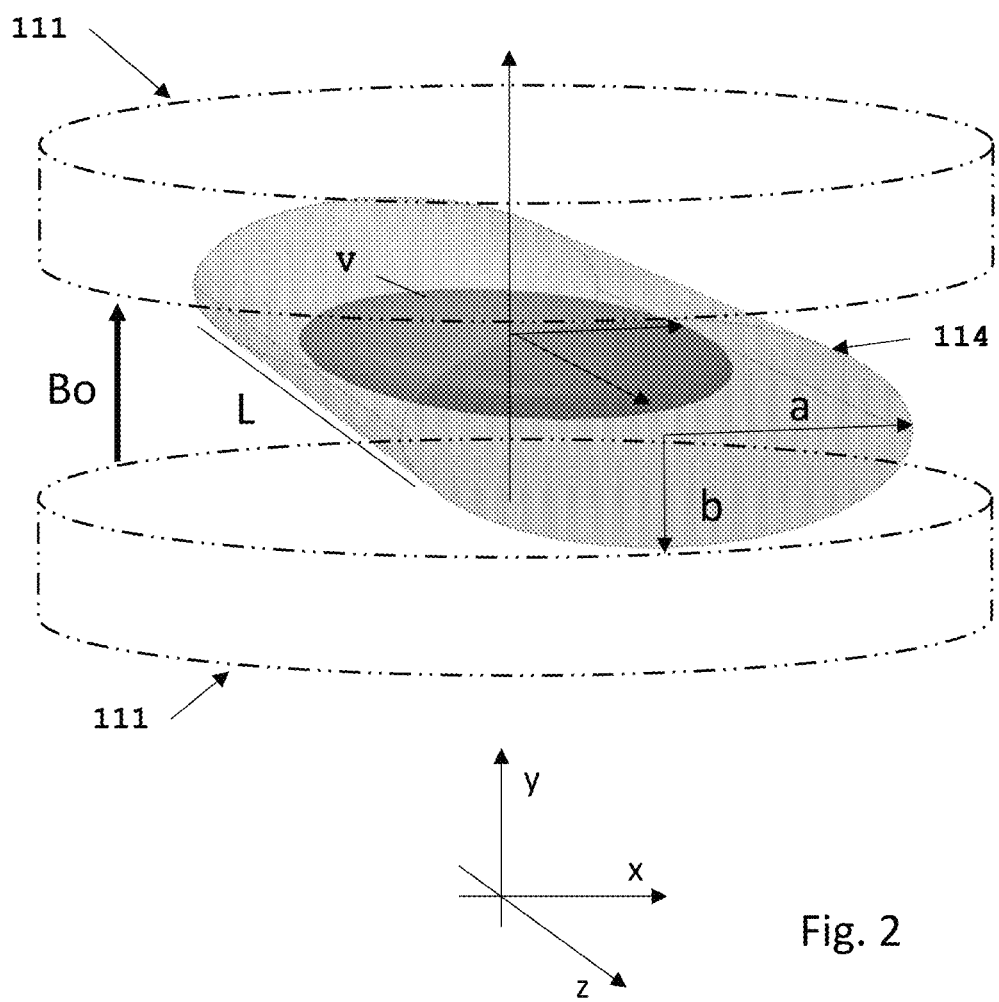
FIG. 2 is a simplified representation of the elliptic cylindrical surface along which the winding patterns of the gradient coils lies according to the present invention in combination with a region of interest in the form of an ellipsoid enclosed by the said elliptic cylindrical surface and where the variables describing the elliptic cylindrical surface and the coordinate system are shown. Furthermore, the two poles of the magnet structure of the MRI system are also schematically indicated.
Figure 3:
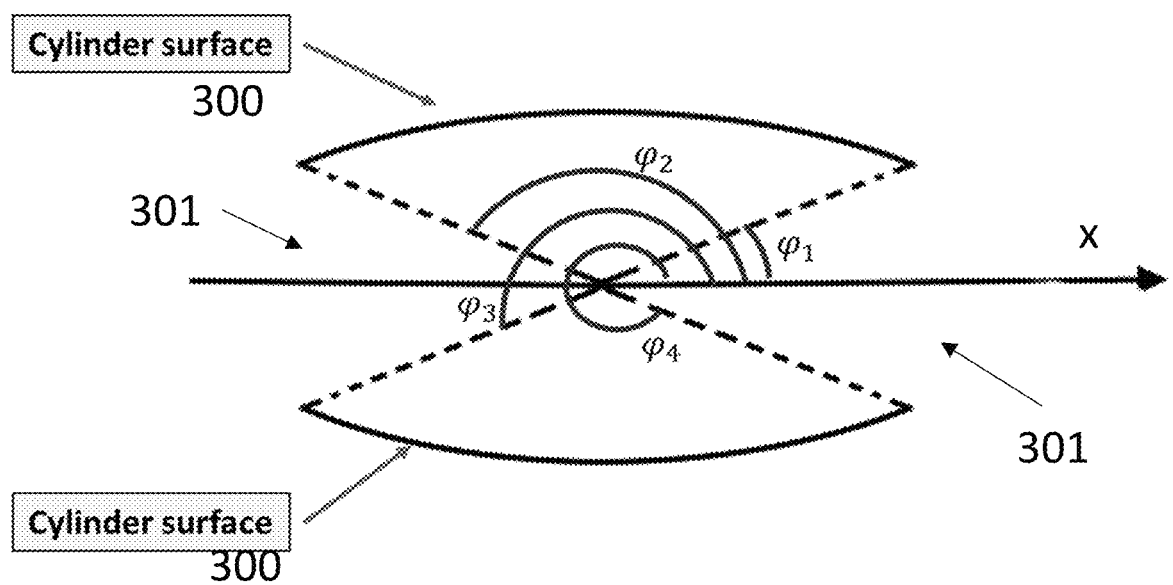
FIG. 3 is a view along the longitudinal axis in the z-direction of the elliptic cylindrical surface showing the angular coordinate φ having different values and showing the splitting of the elliptic cylindrical surface into two separate sectors provided with a winding pattern of an elliptic cylindrical gradient coil according to the present invention.

Referring to FIGS. 2 to 3, the geometric relations between the elliptic cylindrical surface on which the winging patterns of the x, y and z gradient coils extend and a region of interest ROI indicate by V and represented by an ellipsoid are shown.

The elliptic cylindrical surface along which the winding patterns extend has a length L in the direction of the longitudinal axis and a major radius "a" and a minor radius "b". The magnet structure of the scanner represented by the two opposite poles 111 generate a static magnetic field B0 that is oriented parallel to the Y-axis of a Cartesian coordinate system indicated in FIG. 2. The minor axis "b" of the elliptic cylindrical surface is parallel to the said y-axis, while the length L is taken in a direction parallel to the z-axis and the major axis "a" of the elliptic cylindrical surface is parallel to the x-axis of the said Cartesian coordinate system, so that the field B0 is oriented transversally to the longitudinal axis and to the length L of the elliptic cylindrical surface.

The ellipsoid has also three axes Rx, Ry, Rz which are parallel to the Cartesian coordinate system and the said axis Rx, Ry and Rz are oriented respectively parallel to the major radius "a", to the minor radius "b" and to the longitudinal axis or the length "L" of the elliptic cylindrical surface which surface encloses the region of interest V.

According to an embodiment the x, y and z gradient coils which are destined to generate gradient magnetic fields for coding MRI signals along the said three directions comprises each one specific patterns of windings which are positioned one over the other forming three layers of winding patterns each extending along an elliptic cylindrical surface having substantially the same dimension fi the thickness of the winding is not considered.

The winding pattern for each gradient coil is determined as already disclosed in the previous description and applying the equations of the already disclosed method steps provides for an embodiment of a specific geometry for each of the said coils which is shown in FIGS. 5A, 5B, 6A, 6B, 7A, 7B. Here each winding pattern is shown as a 3D projection of an elliptic cylindrical surface and as a 2D planar projection on a XZ-plane.

Figure 5A:
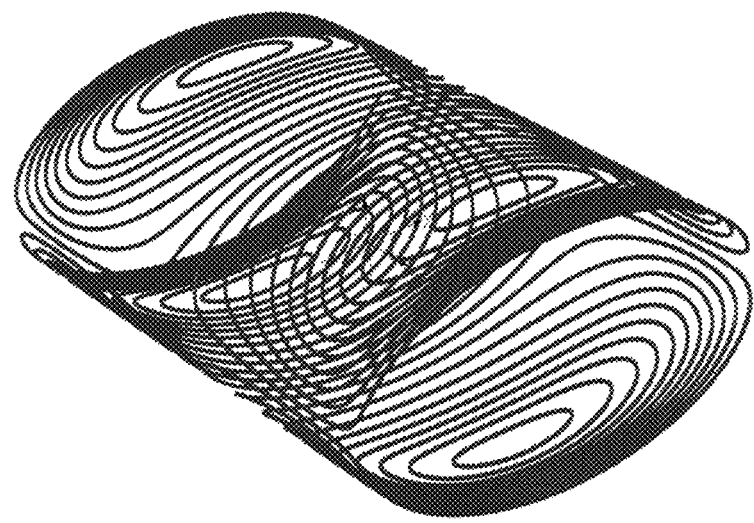
FIGS. 5A and 5B show respectively the left 3D view and the right 2D projection on the XZ-plane of an embodiment of an elliptical cylinder Z-gradient coil.
Figure 5B:
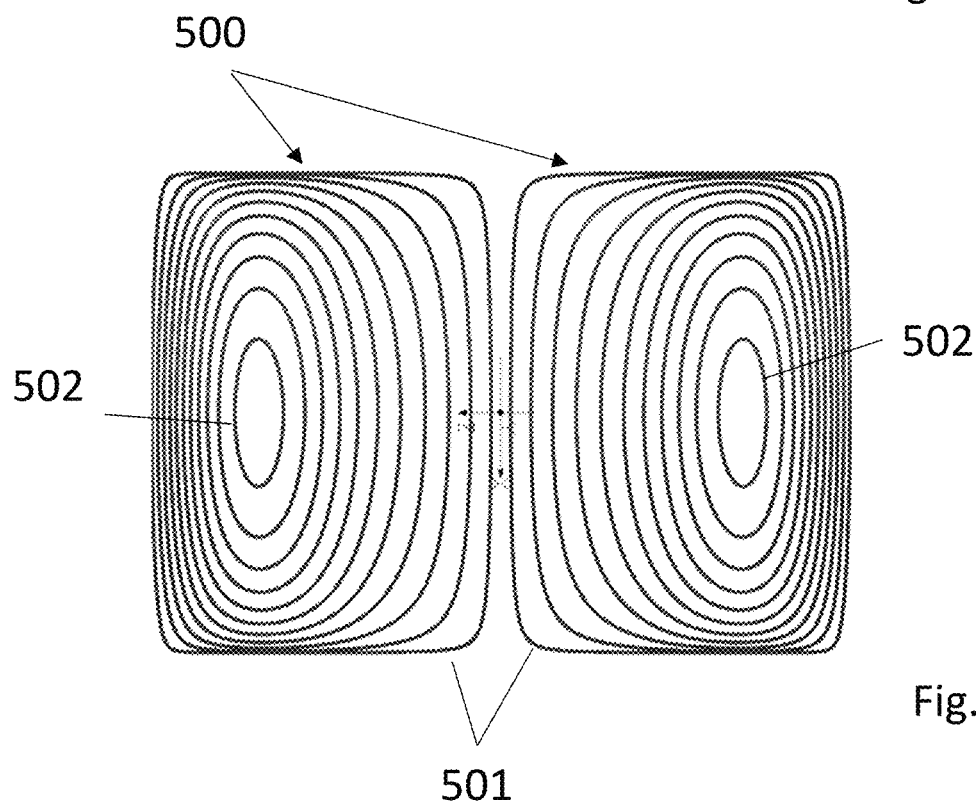

According to FIGS. 5A and 5B, the z gradient coil comprises two sectors of the elliptic cylindrical surface, which are separated by a plane parallel to the longitudinal axis and to the major axis of the elliptic cross section of the said surface. The said separation plane corresponds to the xz plane according to the coordinate system shown in FIG. 2. The two sectors are symmetric with respect to the said separation plane and are formed each one by two series of annular windings 500 which have progressively reduced dimensions and are placed one within the other. The two series of annular windings 500 are symmetric with respect to a transversal cross section plane of the elliptic cylindrical surface dividing the total length of the said surface into two halves.

According to a further feature the said annular windings have a major axis and a minor axis, the major axis being parallel to the major axis of the elliptic cylindrical surface, while the minor axis being parallel to the longitudinal axis of the said elliptic cylindrical surface.

According to still another feature which appears more clearly from FIG. 5B, the most external annular winding 501 is more rectangular in shape, while most inner one 502 has an elliptical shape, while the intermediate windings becomes more and more rounded in shape passing from the most external one to the most internal one.

According to still a further feature, the annular windings are not positioned in a concentric manner, but they are placed eccentrically in such a way that the annular windings are closer one to the other in the direction away from the centre of the elliptic cylindrical surface relatively to the longitudinal direction of it.

Figure 6A:
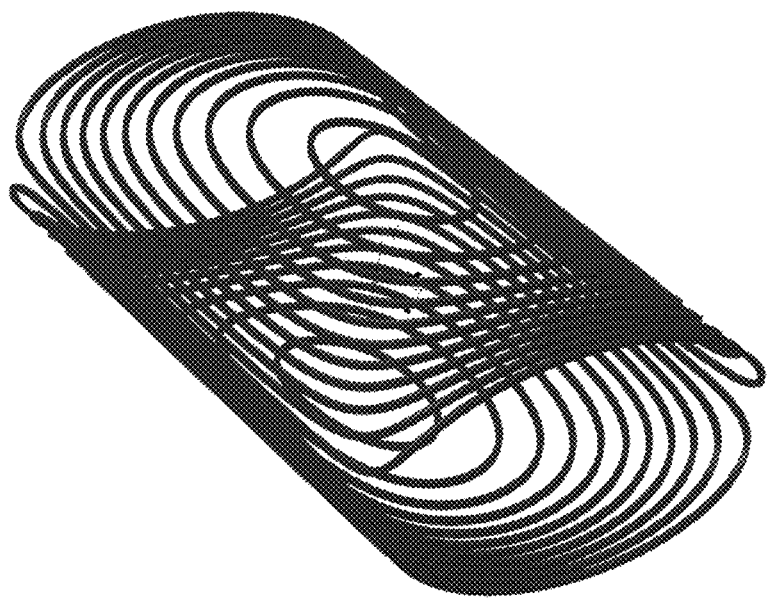
FIGS. 6A and 6B show respectively the left 3D view and the right 2D projection on the XZ-plane of an embodiment of an elliptical cylinder Y-gradient coil.
Figure 6B:
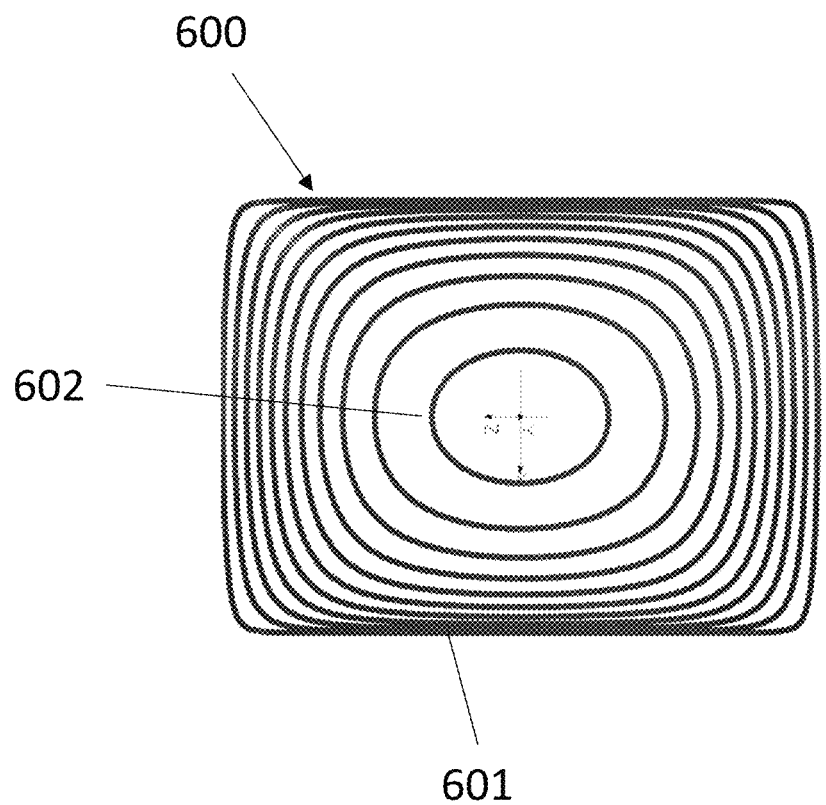

FIGS. 6a and 6b represents the winding pattern in relation to the y gradient coil. In this case, two winding pattern having an identical shape are provided onto two opposing sectors of the elliptic cylindrical surface which are separated by a separation plane parallel to the xz plane of the coordinate system and coinciding with the central longitudinal axis of the elliptic cylindrical surface, similarly to the z-gradient coil of FIGS. 5A and 5B. In this case, each sector of the elliptic cylindrical surface comprises only one group of annular windings having progressively reduced surfaces and being positioned one inside the other.

According to the embodiment shown and particularly in FIG. 6B, the windings have a major axis oriented parallel to the longitudinal axis of the elliptic cylindrical surface and a minor axis oriented parallel to the major axis of the said surface.

Similarly, to the winding pattern of the previous example the most external winding 601 is essentially rectangular, while most inner one has an elliptic shape, while the intermediate windings pass progressively from the rectangular shape to the elliptic one.

According to FIGS. 6A and 6B, the annular windings of the winding pattern 600 are positioned concentric one with the other and the centre is coincident with the centre point on the longitudinal axis of the elliptic cylindrical surface.

Figure 7A:
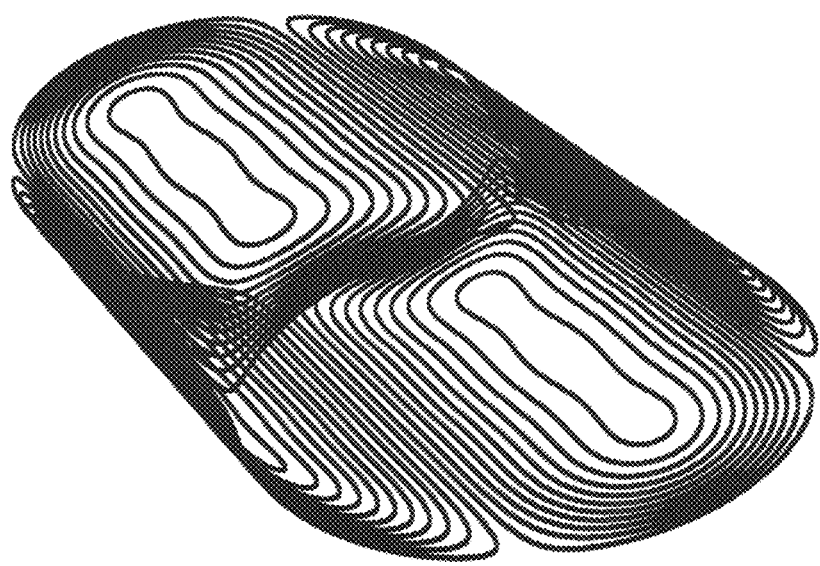
FIGS. 7A and 7B show respectively the left 3D view and the right 2D projection on the XZ-plane of an embodiment of an elliptical cylinder X-gradient coil.
Figure 7B:
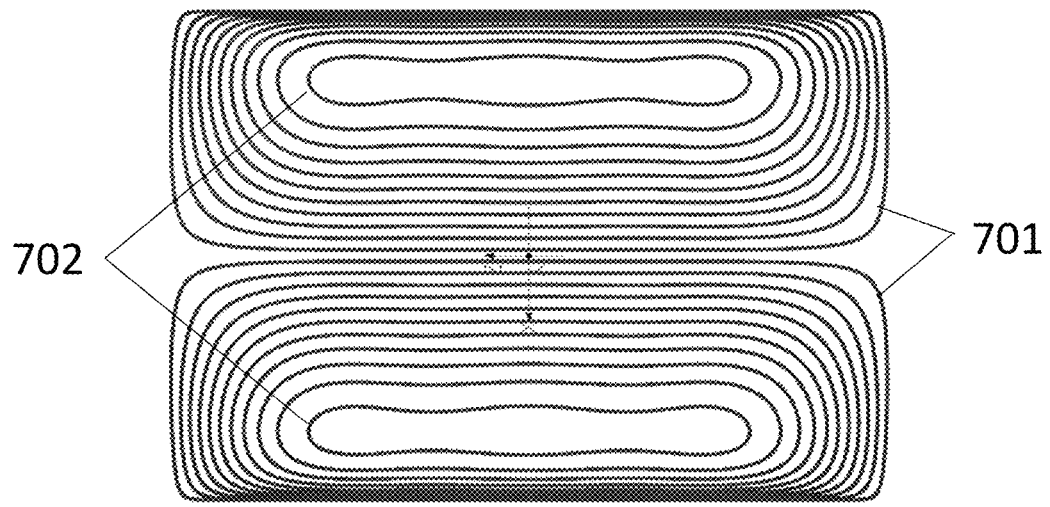

FIGS. 7A and 7B shows the x gradient coil. The x gradient coil is formed by four groups of annular windings which are each one positioned on a sector forming a quadrant of the elliptic cylindrical surface, the said quadrants being separated one form the other according to a plane parallel to the xz-plane and a plane parallel to the yz plane, the two planes crossing each other along the central longitudinal axis of the elliptic cylindrical surface.

According to one feature, the gradient coil of FIGS. 7A and 7B is symmetric relatively to both the said separation planes and each sector corresponding to a quadrant is provided with an identical winding pattern.

According to the shown embodiment, each sector is provided with a group of annular winging having progressively, reduced dimensions and being positioned one inside the other.

According to a further feature, each winding has a major axis, which is aligned with the longitudinal axis of the elliptic cylinder surface and a minor axis, which is parallel to the major axis of the said surface.

In the example of FIGS. 7A and 7B the most external winding 701 has a quite rectangular shape, which progressively changes to an elongated shape with arched ends at the most inner winding 702.

The windings are not positioned concentric one with the other and are closer one to the other in the direction away from the separation plane, which is parallel to the yz-plane.

Referring to FIG. 3, it is possible to modify the above configuration of the x, y and z gradient coils by changing the angular extension of the sectors of the elliptic cylinder surfaces such that the winding patterns covers only partially the elliptical cylinder surface, leaving open sided between then allowing to provide for additional openings which can be used for accessing the gantry by the patient or by service persons or by tools.

In FIG. 3, the windings may extend such as to cover two elliptic cylindrical sectors, which are symmetrically shaped and opposed one to the other relatively to an xz plane. The two elliptic cylindrical sector surfaces 300 covered by the winding pattern according to the embodiments of FIGS. 5 to 7, correspondingly modified relatively to their dimensions, leaves lateral openings 301, which are free from structures and may be used for accessing the imaging volume in the gantry. The different angles φ1 to φ4 shows that it is possible to modify the angular extension of the sectors 300.

Figure 4A:
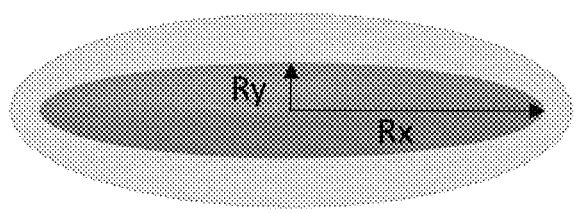
FIGS. 4A to 4C shows the relation between a region of interest consisting in an ellipsoid having radii Rx, Ry and Rz in relation to the elliptic cylindrical surface along which the winding patterns of the gradient coils extend.
Figure 4B:
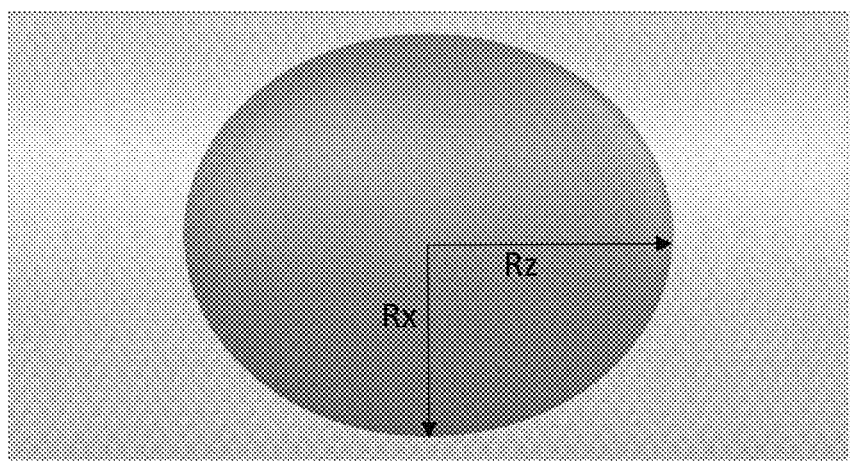
Figure 4C:
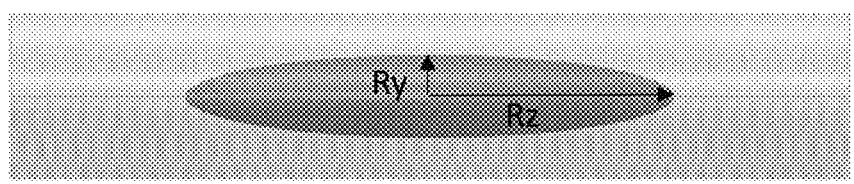
Figure 8A:
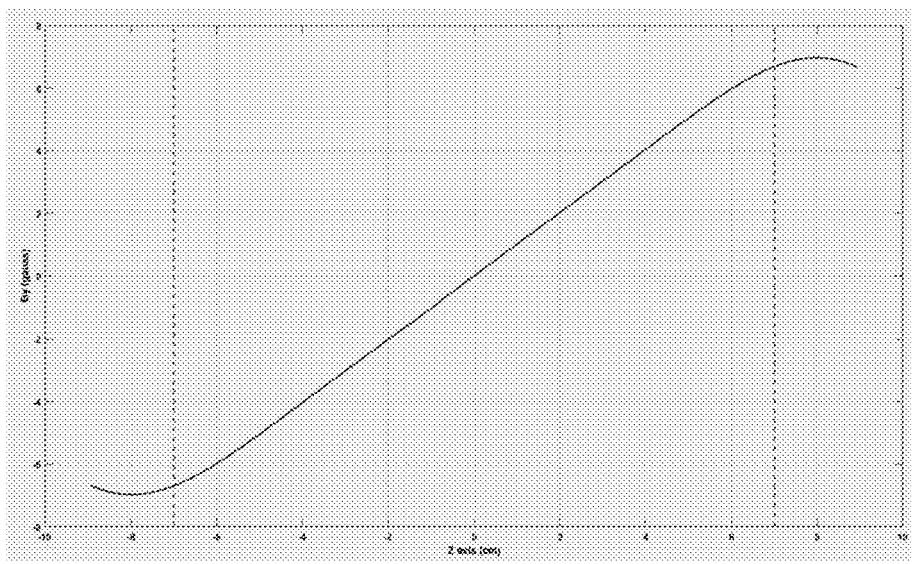
FIGS. 8A, 8B and 8C show respectively a graph representing the field By generated by Z gradient coil along Z axis, the field By generated by X gradient coil along X axis and the field By generated by Y gradient coil along X axis with the dashed lines representing the ROI limits along the corresponding direction.
Figure 8B:
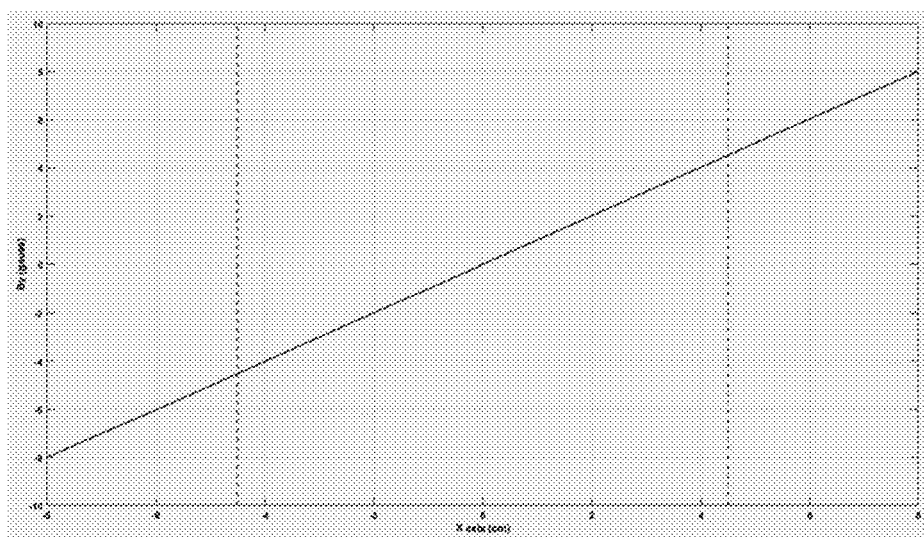
Figure 8C:
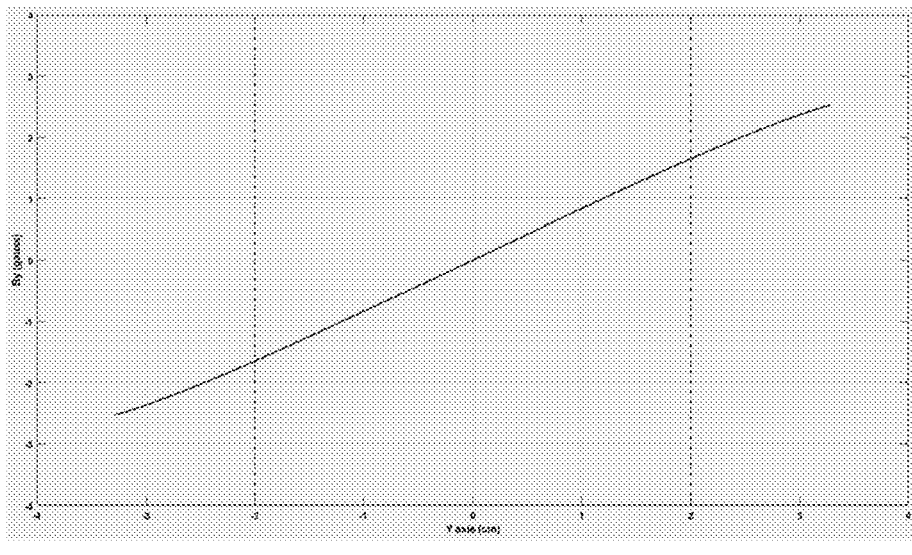
Figure 9:
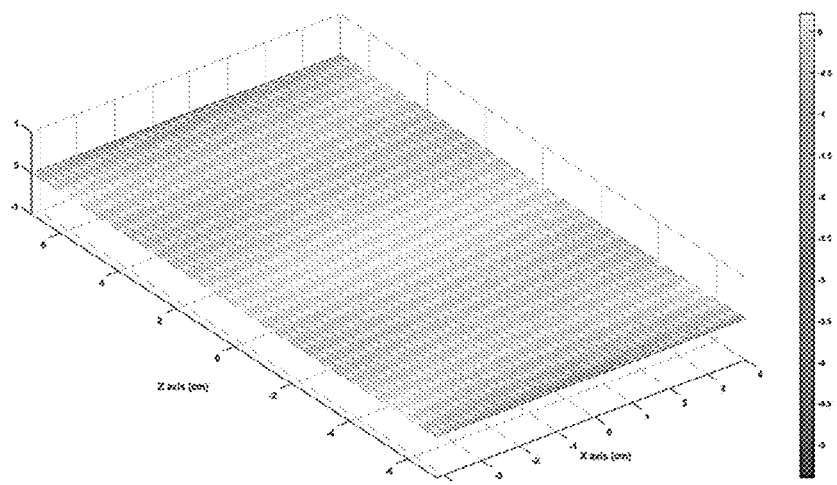
FIG. 9 is a diagram representing the percentage difference between the field By generated by Z gradient coil and the expected one in the ZX plane.
Figure 10:
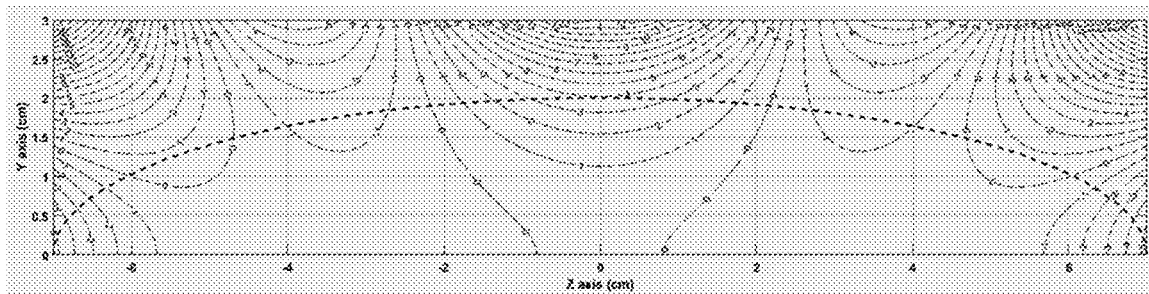
FIG. 10 is a diagram representing the percentage difference between the field By generated by Z gradient coil and the expected one in the ZY plane with the dashed line indicating the ROI limit.
Figure 11:
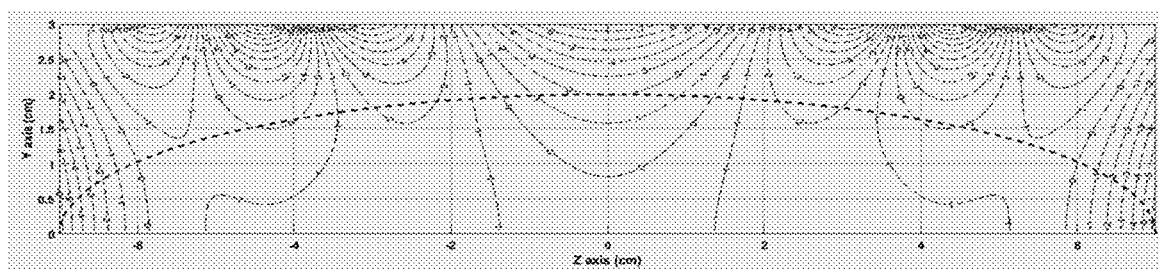
FIG. 11 is a diagram representing the percentage difference between the field By generated by Y gradient coil and the expected one in the ZY plane with the dashed line indicating the ROI limit.
Figure 12:
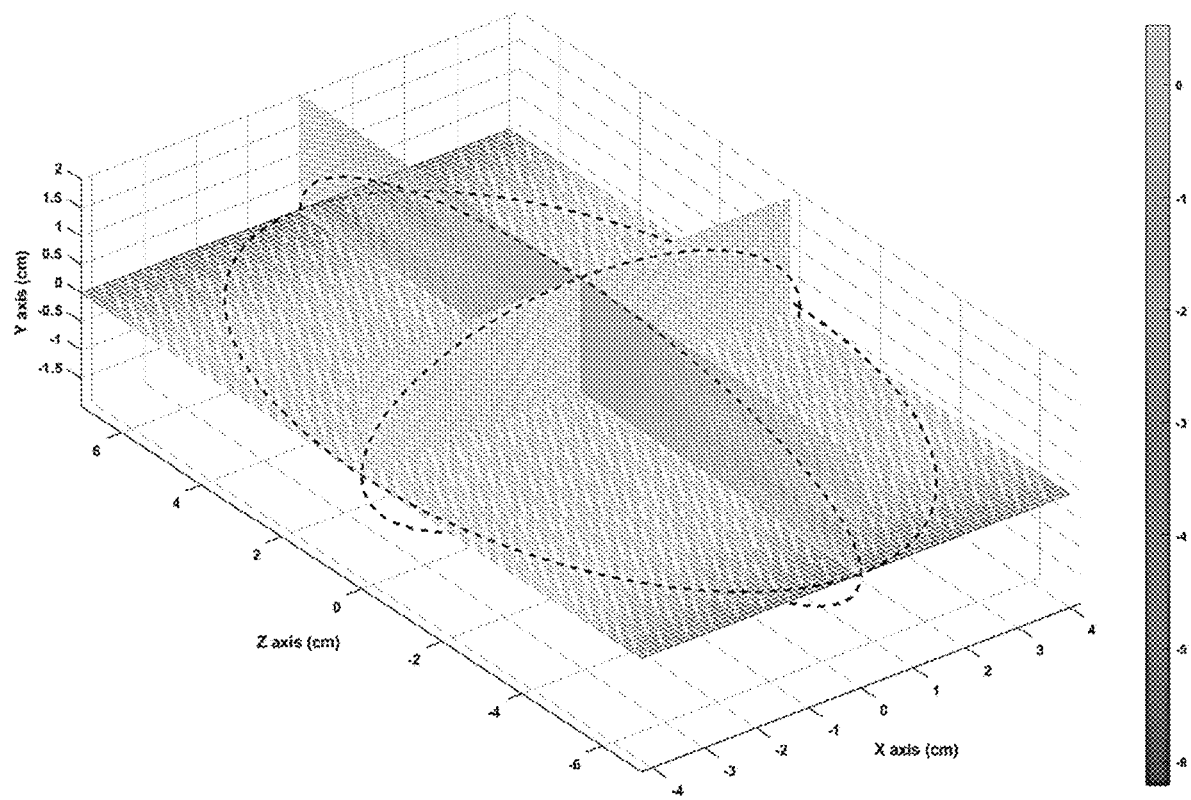
FIG. 12 is a diagram representing the % difference between the field By generated by X gradient coil and the expected one in the ZX, ZY and XY planes with the dashed lines indicating the ROI projections on the said planes.

FIGS. 8A to 8C shows a practical simulation of the magnetic field generated within the space delimited by the ellipsoid representing the region of interest as shown in FIGS. 4A to 4C. The dotted lines represents the limits of the region of interest along the corresponding direction and the gradient field along the z, y and x-axis is shown. As it appears from the diagrams, the data simulation has shown that the field is highly linear within the limits of the region of interest.

The FIGS. 9 to 12 show different diagram representations of the percent difference between the gradient filed generated by the gradient coils according to the simulation using the winding pattern described above and the expected one.

From the above diagram appears that the maximum threshold value for an allowable error consisting of 5% is respected.

Figure 14:
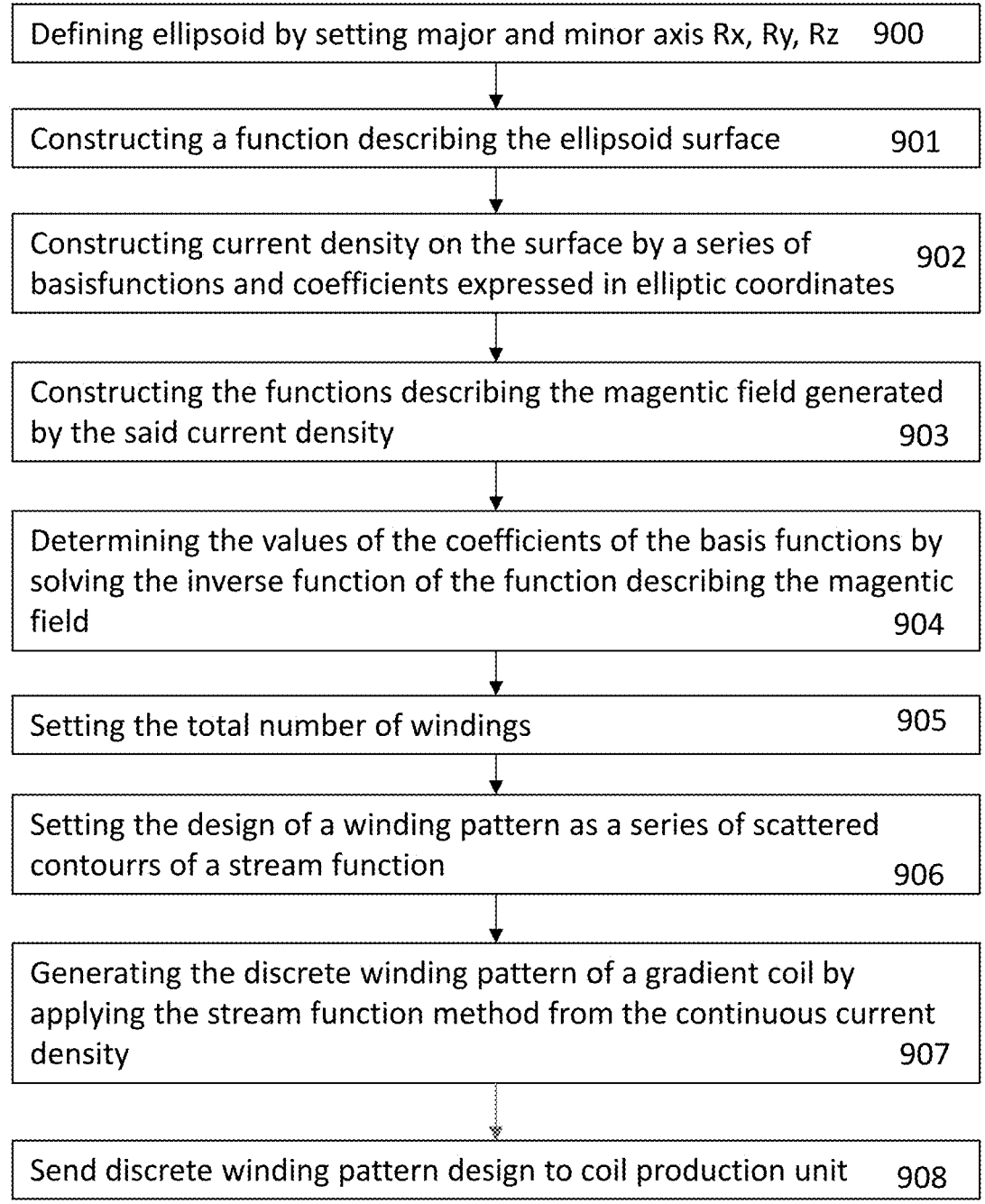
FIG. 14 is a flow diagram of an embodiment of the method.

FIG. 14 illustrates a flow diagram of an embodiment of the method. The exact mathematical functions and the mathematical method of the stream function are disclosed in a detailed manner in the above description.

In order to carry out the method as also shown in FIGS. 2 to 4 the ellipsoid along whose surface the windings of the coil will be constructed shall be defined by setting the basic parameters defining this ellipsoid and which are basically the three axis Rx, Ry, Rz.

Applying the function describing the elliptic surface to the data setting the Rx, Ry and Rz axis the surface is constructed as indicated at step 901.

At step 902 the current density on the elliptic surface is defined by using a series of basis functions. According to an embodiment as basis functions trigonometric functions in elliptical-cylinder coordinates are used according to the following equations:

$$J_\varphi = \sum_{p=1}^{P} \frac{U_p}{2} \beta \cos[\beta(z - z_{min})] \sin 2\varphi$$

$$J_z = -\frac{1}{h_\varphi} \sum_{p=1}^{P} \frac{U_p}{2} \sin[\beta(z - z_{min})] \cos 2\varphi$$

At step 903 the current density equations are used to construct the equations describing the magnetic field. This is done by applying the Biot-Savart law according to equation (3) thus obtaining equations (5) and in the matrix form equation (6).

The wingiond design is obtained by solving the inverse function of the above equation and thus determining the coefficient values of the series of basis functions. This si indicated by steps 904 to 907. In order to solve the inverse function a strem function method is applied and the parameters relating to a desired number of windings and the winding design pattern are set.

Applying the stream function is theoretically disclosed in the previous description. The results of the processing provide for a winding design as illustrated in the FIGS. 5 to 12 and the design pattern of the windings is used by the production until to construct the coil as indicated at step 908.

Figure 13:
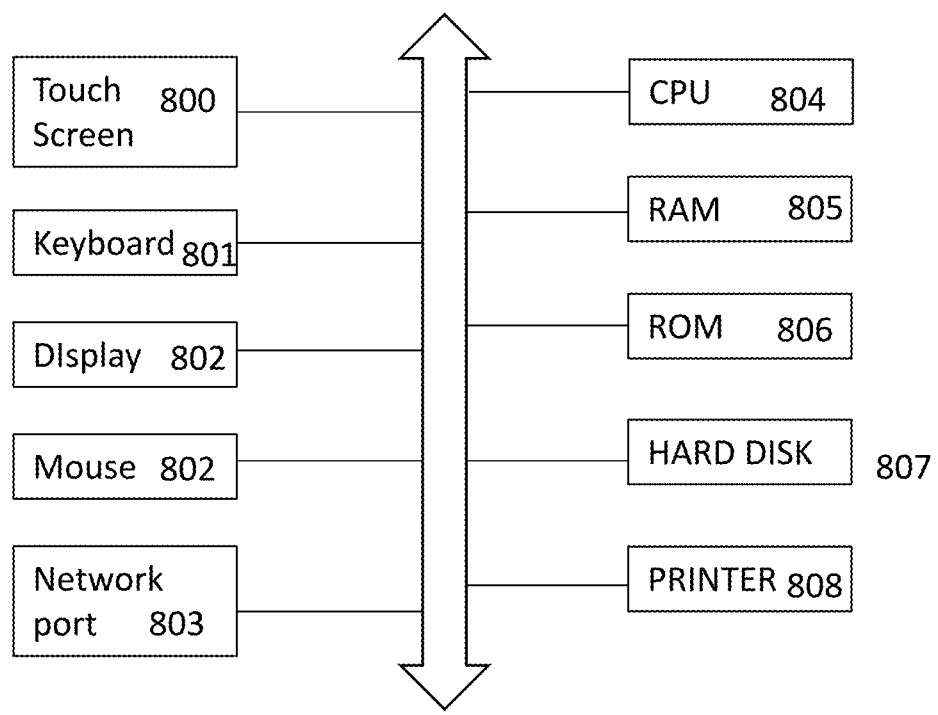
FIG. 13 is a block diagram of a processing unit which can be used in order to carry out the method.

FIG. 13 show a block diagram of a processing unit which can be used in order to carry out the method according to the different embodiments described.

The processing unit may be a conventional processing unit such as a personal computer, a workstation or other similar devices. FIG. 13 show a generic construction of such a processing units.

A CPU 804 carry out the instructions coded in a program executed by the processing unit. The program comprises the instructions for managing unser input data, output data and for carrying out the steps defined by the equations and mathematical methods described above.

The CPU 804 also manages the interactions and data exchange between several other peripherals. The input of the settings needed to carry out the method such as the input of the settings of the dimensions of the axis of the ellipsoid at step 900 and the number of windings at step 905 and the design pattern of the windings at step 906 can be carried out by one or more user inout interfaces such as a touchscreen 800, a keyboard 801, a mouse 802 and other similar devices. Data can also be inputted by reading a file in which the said data is recorded. The file can be stored on a portable memory device such as a USB key a portable hard disk, a CD or DVD Ram or a CD or DVD Rom. A corresponding reader is provided in the processing unit. Data output can be in the form of a display 802 a touch screen 800, a printer 808. Data output can be also provided in the form of a file which is stored on a portable memory device sucha as a USB key a portable hard disk, a CD or DVD Ram or a CD or DVD Rom. In this case the system may be provided with a corresponding storage device writing unit.

In order to carry out the process steps the processing unit has also different kinds of memories such as RAM 805, ROM 806 and a Hard disk 807 or other kind of mass storage devices. Typical functions of the rAM is to load the current programs in executions, while the ROM memory contains the firmware of the system. The hard disk 807 or similar mass storage devices contains the software in which the instructions are codade for carrying out the processing steps on the settings inputted by the user.

A network interface 803 which can be alternatively or in combination a wired or a wireless one allows also for inputting data from remote stations or for transmitting output data to remote stations.

In an embodiment the winding design of the coil generated by carrying out the processing steps can be sent to the production unit, namely to the control station of a production unit by meand of the said network interface 803.

It should be clearly understood that the various arrangements and processes broadly described and illustrated with respect to the FIGS., and/or one or more individual components or elements of such arrangements and/or one or more process operations associated of such processes, can be employed independently from or together with one or more other components, elements and/or process operations described and illustrated herein. Accordingly, while various arrangements and processes are broadly contemplated, described and illustrated herein, it should be understood that they are provided merely in illustrative and non-restrictive fashion, and furthermore can be regarded as but mere examples of possible working environments in which one or more arrangements or processes may function or operate.

Aspects are described herein with reference to the FIGS., which illustrate example methods, devices and program products according to various example embodiments. These program instructions may be provided to a processor of a general purpose computer, special purpose computer, or other programmable data processing device or information handling device to produce a machine, such that the instructions, which execute via a processor of the device implement the functions/acts specified. The program instructions may also be stored in a device readable medium that can direct a device to function in a particular manner, such that the instructions stored in the device readable medium produce an article of manufacture including instructions which implement the function/act specified. The program instructions may also be loaded onto a device to cause a series of operational steps to be performed on the device to produce a device implemented process such that the instructions which execute on the device provide processes for implementing the functions/acts specified.

One or more of the operations described above in connection with the methods may be performed using one or more processors. The different devices in the systems described herein may represent one or more processors, and two or more of these devices may include at least one of the same processors. In one embodiment, the operations described herein may represent actions performed when one or more processors (e.g., of the devices described herein) execute program instructions stored in memory (for example, software stored on a tangible and non-transitory computer readable storage medium, such as a computer hard drive, ROM, RAM, or the like).

The processor(s) may execute a set of instructions that are stored in one or more storage elements, in order to process data. The storage elements may also store data or other information as desired or needed. The storage element may be in the form of an information source or a physical memory element within the controllers and the controller device. The set of instructions may include various commands that instruct the controllers and the controller device to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

The controller may include any processor-based or microprocessor-based system including systems using microcontrollers, reduced instruction set computers (RISC), application specific integrated circuitry (ASICs), field-programmable gate arrays (FPGAs), logic circuitry, and any other circuit or processor capable of executing the functions described herein. When processor-based, the controller executes program instructions stored in memory to perform the corresponding operations. Additionally or alternatively, the controllers and the controller device may represent circuitry that may be implemented as hardware. The above examples are exemplary only, and are thus not intended to limit in any way the definition and/or meaning of the term "controller."

Optionally, aspects of the processes described herein may be performed over one or more networks one a network server. The network may support communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers and business application servers. The server(s) also may be capable of executing programs or scripts in response to requests from user devices, such as by executing one or more web applications that may be implemented as one or more scripts or programs written in any programming language, such as Java®, C, C # or C++, or any scripting language, such as Ruby, PHP, Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The embodiments described herein may include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Various embodiments may further include receiving, sending, or storing instructions and/or data implemented in accordance with the foregoing description upon a computer-readable medium. Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

The invention claimed is:

1. Gradient coils in combination with a magnet of an MRI system, the gradient coils being driven by a control unit for generating gradient fields along three Cartesian axes of a Cartesian coordinate system, the gradient fields permeating a region of interest, the gradient coils comprising:
discrete winding patterns configured to generate a current distribution on a surface of an elliptical cylinder having a longitudinal axis, the magnet of the MRI system generating a static magnetic field oriented perpendicular to the longitudinal axis of the elliptic cylindrical surface;
wherein:
one of the gradient coils, which is configured to generate a gradient field in a z-direction of the Cartesian coordinate system, the one gradient coil, extending on an elliptical cylindrical surface of the elliptical cylinder, comprises identical winding patterns on two halves of the elliptical cylindrical surface along a separation plane of the said two halves, which separation plane is parallel to the longitudinal axis and to a maximum radius of the elliptical cylindrical surface.

2. Gradient coils according to claim 1 in which said gradient coils are configured to generate the gradient fields in a region of interest (ROI) defined by an ellipsoid enclosed in the elliptic cylindrical surface.

3. Gradient coils according to claim 1, wherein each one of the gradient coils generating respectively a gradient field in one of the three directions of the Cartesian coordinate system, each of the said gradient coils comprising discrete winding patterns configured to generate a current distribution on the elliptical cylindrical surface, the windings of the three gradient coils extending on the elliptic cylindrical surface layered one over the other, thus forming three layers of discrete winding patterns of the said gradient coils.

4. Gradient coils according to claim 1, in which each winding pattern of two symmetrical winding patterns on each half of the elliptic cylindrical surface is formed by a plurality of annular windings which are positioned one inside the other having progressively reduced dimensions.

5. Gradient coil according to claim 1, in which the said windings are eccentric closed loop or annular windings.

6. Gradient coils according to claim 1, in which the said windings are non-circular closed loop or annular windings.

7. Gradient coils according to claim 1, in which, windings are closed loop or annular windings designed such that a more external one is essentially rectangular having a major diameter parallel to a major radius of the elliptical-cylindrical surface and a most inner one has an elliptic form while intermediate windings progressively change their shape from a quite rectangular of the most external one to the elliptic form of the most internal one.

8. Gradient coils according to claim 1, wherein the gradient coil generating a gradient field in a y-direction of the Cartesian coordinate system is formed by only one winding pattern for each one of two halves of the elliptic-cylindrical surface along a separation plane of the two halves, which is a plane parallel to the longitudinal axis and to a major radius of the elliptic-cylindrical surface, the two winding patterns being symmetric relatively to a plane of symmetry which is coincident or parallel to a plane of separation.

9. Gradient coils according to claim 8, in which each winding pattern is formed by a plurality of annular or closed loop windings positioned one inside the other.

10. Gradient coil according to claim 8, in which the winding patterns have a major diameter, which is parallel to the longitudinal axis of the elliptic cylindrical surface.

11. Gradient coils according to claim 8, wherein the windings are closed loop or annular windings and are designed such that the more external one is essentially rectangular having a major diameter parallel to the longitudinal axis of the elliptical-cylindrical surface and the most inner one has an elliptic shape while intermediate windings progressively change their shape from quite rectangular of the most external one to the elliptic shape of the most internal one.

12. Gradient coils according to claim 1, wherein the gradient coil generating a gradient field in the y-direction of the Cartesian coordinate system and extending on the elliptical cylindrical surface comprises identical winding patterns on two halves of the elliptic-cylindrical surface along a separation plane of the said two halves which is a plane parallel to the longitudinal axis and to a maximum radius of the elliptic-cylindrical surface, while on each half of the elliptical-cylindrical surface two winding patterns are provided which are symmetric with respect of a section plane at a center of the elliptical-cylindrical surface and which plane is parallel to the longitudinal axis of the said elliptic-cylindrical surface and parallel to a minor axis of an elliptic cross section of the elliptic cylindrical surface.

13. Gradient coils according to claim 12 in which, each winding pattern of the two symmetrical winding patterns on each half of the elliptic cylindrical surface is formed by a plurality of annular windings which are positioned one inside the other having progressively reduced dimensions.

14. Gradient coil according to claim 12 in which the said windings are eccentric closed loop or annular windings.

15. Gradient coils according to claim 12 in which the windings are closed loop or annular windings and are designed such that a more external one is essentially rectangular having a major diameter parallel to the longitudinal axis of the elliptical-cylindrical surface and a most inner one has an elongated shape with rounded ends while intermediate windings progressively change their shape from a quite rectangular of the most external one to the shape of the most internal one.

* * * * *